United States Patent
Guo et al.

(12)

(10) Patent No.: US 6,310,751 B1
(45) Date of Patent: Oct. 30, 2001

(54) ANTI-PARALLEL LONGITUDINAL PATTERNED EXCHANGE BIASED DUAL STRIPE MAGNETORESISTIVE (DSMR) SENSOR ELEMENT AND METHOD FOR FABRICATION THEREOF

(75) Inventors: Yimin Guo, San Jose; Kochan Ju, Fremont; Hui-Chuan Wang, Pleasanton; Simon H. Liao, Fremont, all of CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/182,775

(22) Filed: Oct. 30, 1998

(51) Int. Cl.$^7$ ........................................... G11B 5/39
(52) U.S. Cl. ........................... 360/315; 360/327.32
(58) Field of Search ..................... 360/315, 314, 360/317, 327.31, 327.32, 327.3

(56) References Cited

U.S. PATENT DOCUMENTS

| | | | |
|---|---|---|---|
| 4,785,366 | 11/1988 | Kranbi et al. | 360/113 |
| 5,079,831 | 1/1992 | Reid | 29/603 |
| 5,406,433 | 4/1995 | Smith | 360/113 |
| 5,666,247 | 9/1997 | Schultz | 360/113 |
| 5,684,658 | 11/1997 | Shi et al. | 360/113 |
| 5,696,654 | * 12/1997 | Gill et al. | 360/113 |
| 5,706,151 | * 1/1998 | Smith | 360/113 |
| 5,721,008 | * 2/1998 | Huang et al. | 427/123 |
| 5,748,399 | 5/1998 | Gill | 360/66 |
| 5,784,772 | * 7/1998 | Ewasko et al. | 29/603.15 |

FOREIGN PATENT DOCUMENTS 7-220244 * 8/1995 (JP) .

OTHER PUBLICATIONS

Ashar, magnetic Disk Drive Technology: Heads Media, Channel, Interfaces and Integration, IEEE, Inc, New York, 1997, pp. 142–146.

* cited by examiner

Primary Examiner—William Klimowicz
(74) Attorney, Agent, or Firm—George O. Saile; Stephen B. Ackerman (57) ABSTRACT

A dual stripe magnetoresistive (DSMR) sensor element, and a method for fabricating the dual stripe magnetoresistive (DSMR) sensor element. When fabricating the dual stripe magnetoresistive (DSMR) sensor element while employing the method, there are employed two pair of patterned longitudinal magnetic biasing layers formed of a single longitudinal magnetic biasing material longitudinally magnetically biased in substantially anti-parallel directions. When longitudinally magnetically biasing the second pair of patterned longitudinal magnetic biasing layers there is employed a thermal annealing method employing a thermal annealing temperature, a thermal annealing exposure time and an extrinsic magnetic bias field strength such that the pair of longitudinally magnetically biased patterned first longitudinal magnetic biasing layers is not substantially demagnetized.

9 Claims, 3 Drawing Sheets

ANTI-PARALLEL LONGITUDINAL PATTERNED EXCHANGE BIASED DUAL STRIPE MAGNETORESISTIVE (DSMR) SENSOR ELEMENT AND METHOD FOR FABRICATION THEREOF

BACKGROUND OF THE INVENTION

1. Field of the Invention

The present invention relates generally to methods for fabricating magnetic sensor elements. More particularly, the present invention relates to methods for fabricating dual stripe magnetoresistive (DSMR) sensor elements with enhanced signal amplitudes.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically determined as a real storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data from and into the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data from and into a magnetic data storage medium, it is known in the art of magnetic read-write head fabrication that magnetoresistive (MR) sensor elements employed within magnetoresistive (MR) read-write heads are generally superior to other types of magnetic sensor elements when employed in retrieving digitally encoded magnetic data from a magnetic data storage medium. In that regard, magnetoresistive (MR) sensor elements are generally regarded as superior since magnetoresistive (MR) sensor elements are known in the art to provide high output digital read signal amplitudes, with good linear resolution, independent of the relative velocity of a magnetic data storage medium with respect to a magnetoresistive (MR) read-write head having the magnetoresistive (MR) sensor element incorporated therein. Within the general category of magnetoresistive (MR) sensor elements, dual stripe magnetoresistive (DSMR) sensor elements, and in particular longitudinal patterned exchange biased dual stripe magnetoresistive (DSMR) sensor elements, are presently of considerable interest insofar as the multiple magnetically biased magnetoresistive (MR) layers employed within longitudinal patterned exchange biased dual stripe magnetoresistive (DSMR) sensor elements typically provide enhanced magnetic read signal amplitude and fidelity in comparison with both single stripe magnetoresistive (MR) sensor elements and non-longitudinal patterned exchange biased dual stripe magnetoresistive (DSMR) sensor elements.

While longitudinal patterned exchange biased dual stripe magnetoresistive (DSMR) sensor elements are thus desirable within the art of digitally encoded magnetic data storage and retrieval, longitudinal patterned exchange biased dual stripe magnetoresistive (DSMR) sensor elements are nonetheless not entirely without problems within the art of digitally encoded magnetic data storage and retrieval. In particular, as a data track width within a magnetic medium employed within digitally encoded magnetic data storage and retrieval decreases, it becomes increasingly important that a read track width within a longitudinal patterned exchange biased dual stripe magnetoresistive (DSMR) sensor element employed in reading the data within the data track be uniformly magnetically biased. Uniform magnetic bias profiles are desirable within read track widths of longitudinal patterned exchange biased dual stripe magnetoresistive (DSMR) sensor elements since such uniform longitudinal magnetic bias profiles provide for optimal magnetic read signal amplitudes within such longitudinal patterned exchange biased dual stripe magnetoresistive (DSMR) sensor elements.

It is thus towards the goal of providing, for use within magnetic data storage and retrieval a longitudinal patterned exchange biased dual stripe magnetoresistive (DSMR) sensor element with a uniform magnetic bias profile across a read track width of the longitudinal patterned exchange biased dual stripe magnetoresistive (DSMR) sensor element that the present invention is most generally directed.

Various methods and resultant magnetic sensor element structures have been disclosed in the art of magnetic sensor element fabrication for forming longitudinal patterned exchange biased magnetic sensor elements with enhanced functionality, enhanced reliability or other desirable properties.

For example, general considerations pertinent to both intrinsic and extrinsic magnetic biasing of magnetoresistive (MR) layers within magnetoresistive (MR) sensor elements, including but not limited to dual stripe magnetoresistive (DSMR) sensor elements, are disclosed within Ashar, Magnetic Disk Drive Technology: Heads, Media, Channel, Interfaces and Integration, IEEE, Inc., New York, 1997, pp. 142–46. Similarly, Schultz, in U.S. Pat. No. 5,666,247, discloses a general method for forming for use within a magnetoresistive (MR) sensor element a magnetoresistive (MR) ferromagnetic layer having an antiferromagnetic layer formed thereupon to provide the magnetoresistive (MR) sensor element with an enhanced magnetic exchange bias of the antiferromagnetic layer with respect to the magnetoresistive (MR) ferromagnetic layer. Within the method, the antiferromagnetic layer is formed at a comparatively low sputter power density in absence of a bias magnetic field, and the antiferromagnetic layer and the underlying magnetoresistive (MR) ferromagnetic layer are then subsequently simultaneously thermally annealed at a comparatively low temperature for a comparatively long time period.

In addition, several disclosures specifically directed towards improved magnetic biasing within soft adjacent layer (SAL) magnetoresistive (MR) sensor elements may also be found within the art of magnetic sensor element fabrication. Included within such disclosures are: (1) Krounbi et al., in U.S. Pat. No. 4,785,366 (a soft adjacent layer (SAL) magnetoresistive sensor element having an antiferromagnetic magnetic biasing layer completely covering a first surface of a soft adjacent layer (SAL) within the soft adjacent layer (SAL) magnetoresistive (MR) sensor element, where the first surface of the soft adjacent layer (SAL) is opposite a second surface of the soft adjacent layer (SAL) which is separated from a track width of a magnetoresistive (MR) layer by a non-magnetic spacer layer); and (2) Chen et al., in U.S. Pat. No. 5,325,253 (a soft adjacent layer (SAL) magnetoresistive (MR) sensor element employing a pair of patterned antiferromagnetic magnetic biasing layers formed upon a pair of opposite ends of a magnetoresistive (MR) layer, a central portion of which magnetoresistive (MR) layer is separated from a soft adjacent layer (SAL) by a non-magnetic spacer layer).

Further, several disclosures which are directed more specifically towards dual stripe magnetoresistive (DSMR) sensor elements, and may include magnetic biasing considerations of such dual stripe magnetoresistive (DSMR) sensor elements, may also be found within the art of magnetoresistive (MR) sensor element fabrication. Included within such disclosures are: (1) Reid, in U.S. Pat. No. 5,079,831 (a dual stripe magnetoresistive (DSMR) sensor element fabricated employing two separate substrates each having one magnetoresistive (MR) layer formed thereupon, where the two separate substrates are subsequently carefully aligned and mated during a process employed for fabricating the dual stripe magnetoresistive (DSMR) sensor element); (2) Smith, in U.S. Pat. No. 5,406,433 (a dual stripe magnetoresistive (DSMR) sensor element where each magnetoresistive (MR) layer is fabricated with a height at least ten times a trackwidth of the dual stripe magnetoresistive (DSMR) sensor element, such that the dual stripe magnetoresistive (DSMR) sensor element may be employed for sensing magnetic signals of increased linear density and decreased track spacing); and (3) Shi et al., in U.S. Pat. No. 5,684,658 (a dual stripe magnetoresistive (DSMR) sensor element where a first trackwidth of a first magnetoresistve (MR) layer is physically offset from a second trackwidth of a second magnetoresistive (MR) layer, to provide in conjunction with an electromagnetic bias direction of the two magnetoresistive (MR) layers variable off-track performance characteristics of the dual stripe magnetoresistive (DSMR) sensor element).

Finally, Gill, in U.S. Pat. No. 5,748,399, discloses a spin valve magnetoresistive (MR) sensor element and a method for fabricating the spin valve magnetoresistive (MR) sensor element, where the spin valve magnetoresistive (MR) sensor element is not catastrophically affected by temperature excursions incident to fabrication or operation of the spin valve magnetoresistive (MR) sensor element. The spin valve magnetoresistive (MR) sensor element realizes this object by fabricating the spin valve magnetoresistive (MR) sensor element with a magnetic biasing such that it is electrically resettable to an initialized operational state after an otherwise catastrophic temperature excursion.

Desirable within the art of longitudinal patterned exchange biased dual stripe magnetoresistive (DSMR) sensor element fabrication are additional methods and materials which may be employed for forming longitudinal patterned exchange biased dual stripe magnetoresistive (DSMR) sensor elements with enhanced magnetic bias uniformity of the longitudinal patterned exchange biased dual stripe magnetoresistive (DSMR) sensor elements within the trackwidths of the longitudinal patterned exchange biased dual stripe magnetoresistive (DSMR) sensor elements.

It is towards the foregoing object that the present invention is directed.

SUMMARY OF THE INVENTION

A first object of the present invention is to provide a longitudinal patterned exchange biased dual stripe magnetoresistive (DSMR) sensor element, and a method for fabricating the longitudinal patterned exchange biased dual stripe magnetoresistive (DSMR) sensor element, where the longitudinal patterned exchange biased dual stripe magnetoresistive (DSMR) sensor element has an enhanced magnetic bias profile uniformity within a trackwidth of the longitudinal patterned exchange biased dual stripe magnetoresistive (DSMR) sensor element.

A second object of the present invention is to provide a longitudinal patterned exchange biased dual stripe magnetoresistive (DSMR) sensor element and a method for fabricating the longitudinal patterned exchange biased dual stripe magnetoresistive (DSMR) sensor element in accord with the first object of the present invention, which method is readily commercially implemented.

In accord with the objects of the present invention, there is provided by the present invention a longitudinal patterned exchange biased dual stripe magnetoresistive (DSMR) sensor element and a method for fabricating the longitudinal patterned exchange biased dual stripe magnetoresistive (DSMR) sensor element. To practice the method of the present invention, there is first provided a substrate. There is then formed over the substrate a patterned first magnetoresistive layer. There is also formed contacting a pair of opposite ends of the patterned first magnetoresistive layer a pair of patterned first longitudinal magnetic biasing layers which defines a first trackwidth of the patterned first magnetoresistive layer. The pair of patterned first longitudinal magnetic biasing layers is biased in a first longitudinal magnetic bias direction substantially parallel with an axis of the patterned first magnetoresistive layer which separates the pair of patterned first longitudinal magnetic biasing layers. There is then formed separated from the first trackwidth of the patterned first magnetoresistive layer by a non-magnetic spacer layer a patterned second magnetoresistive layer. There is also formed contacting a pair of opposite ends of the patterned second magnetoresistive (MR) layer a pair of patterned second longitudinal magnetic biasing layers which defines a second trackwidth of the patterned second magnetoresistive (MR) layer. The pair of patterned second longitudinal magnetic biasing layers is biased in a second longitudinal magnetic bias direction anti-parallel with the first longitudinal magnetic bias direction. The pair of patterned first longitudinal magnetic biasing layers and the pair of patterned second longitudinal magnetic biasing layers are formed of a single longitudinal magnetic biasing magnetic material. The pair of patterned second longitudinal magnetic biasing layers is biased in the second longitudinal magnetic bias direction employing a thermal annealing method employing a thermal annealing temperature, a thermal annealing exposure time and an extrinsic magnetic bias field strength such that the pair of patterned second longitudinal magnetic biasing layers is biased in the second longitudinal magnetic bias direction while the pair of patterned first longitudinal magnetic biasing layers is not appreciably demagnetized from the first longitudinal magnetic bias direction.

The method of the present invention contemplates a longitudinal patterned exchange biased dual stripe magnetoresistive (DSMR) sensor element fabricated in accord with the method of the present invention.

The present invention provides a longitudinal patterned exchange biased dual stripe magnetoresistive (DSMR) sensor element, and a method for fabricating the longitudinal patterned exchange biased dual stripe magnetoresistive (DSMR) sensor element, where the longitudinal patterned exchange biased dual stripe magnetoresistive (DSMR) sensor element has an enhanced magnetic bias profile uniformity within a read trackwidth of the longitudinal patterned exchange biased dual stripe magnetoresistive (DSMR) sensor element. The present invention realizes the foregoing object by employing when forming the longitudinal patterned exchange biased dual stripe magnetoresistive (DSMR) sensor element a first magnetoresistive (MR) layer biased in a first longitudinal magnetic bias direction by a pair of longitudinally magnetically biased patterned first longitudinal magnetic biasing layers, where the first longitudinal magnetic bias direction is anti-parallel to a second longitudinal magnetic bias direction of a second magnetoresistive (MR) layer induced by a pair of longitudinally magnetically biased patterned second longitudinal magnetic biasing layers contacting a pair of opposite ends of the patterned second magnetoresistive (MR) layer.

The method of the present invention is readily commercially implemented. The method of the present invention employs thermal annealing methods which are generally known in the art of magnetoresistive (MR) sensor element fabrication. Since it is a process control within the present invention which provides at least in part the method of the present invention, rather than the existence of methods and materials which provides the present invention, the method of the present invention is readily commercially implemented.

Advantageously, a longitudinally magnetically biased dual stripe magnetoresistive (DSMR) sensor element formed in accord with the method of the present invention is formed with a pair of patterned first longitudinal magnetic biasing layers and a pair of patterned second longitudinal magnetic biasing layers formed of a single longitudinal magnetic biasing material, since the pair of patterned second longitudinal magnetic biasing layers is longitudinally magnetically biased in a second longitudinal magnetic bias direction employing a thermal annealing method employing a thermal annealing temperature, a thermal annealing exposure time and an extrinsic magnetic bias field strength such that the pair of patterned second longitudinal magnetic biasing layers is longitudinally magnetically biased in the second longitudinal magnetic bias direction while a pair of patterned first longitudinal magnetic biasing layers is not appreciably demagnetized from a first longitudinal magnetic bias direction anti-parallel the second longitudinal magnetic bias direction.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating a longitudinal patterned exchange biased dual stripe magnetoresistive (DSMR) sensor element, and a longitudinal patterned exchange biased dual stripe magnetoresistive (DSMR) sensor element fabricated in accord with the method, where the longitudinal patterned exchange biased dual stripe magnetoresistive (DSMR) sensor element is fabricated employing two pair of patterned longitudinal magnetic biasing layers formed of a single longitudinal magnetic biasing material, and where the two pair of patterned longitudinal magnetic biasing layers bias a pair of patterned magnetoresistive (MR) layers in anti-parallel directions. When longitudinally magnetically biasing a second pair of patterned longitudinal magnetic biasing layers within the two pair of patterned longitudinal magnetic biasing layers in a second longitudinal magnetic bias direction there is employed a thermal annealing method employing a thermal annealing temperature, a thermal annealing exposure time and an extrinsic magnetic bias field strength such that there is not appreciably demagnetized a first pair of patterned longitudinal magnetic biasing layers which have previously been longitudinally magnetically biased in a first longitudinal magnetic bias direction antiparallel the second longitudinal magnetic bias direction.

Although the preferred embodiment of the present invention illustrates the present invention within the context of fabricating a merged inductive magnetic write dual stripe magnetoresistive (DSMR) read magnetic read-write head which is most likely to be employed within digitally encoded magnetic data storage and retrieval, a longitudinal patterned exchange biased dual stripe magnetoresistive (DSMR) sensor element fabricated in accord with the method of the present invention may be employed within magnetic sensor applications including but not limited to digital magnetic sensor applications and analog magnetic sensor applications employing magnetic heads including but not limited to merged inductive magnetic write magnetoresistive (MR) read magnetic read-write heads, non-merged inductive magnetic write magnetoresistive (MR) read magnetic read-write heads, and read only magnetoresistive (MR) read heads.

Figure 1:
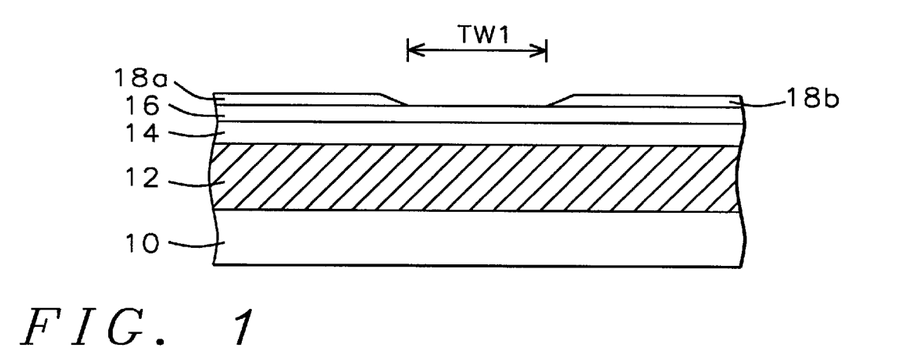
FIG. 1, FIG. 2, FIG. 3, FIG. 4a, FIG. 4b and FIG. 5 show a series of schematic air bearing surface (ABS) view diagrams illustrating the results of progressive stages in forming a merged inductive magnetic write dual stripe magnetoresistive (DSMR) read magnetic read-write head having formed therein a dual stripe magnetoresistive (DSMR) sensor element in accord with the present invention.

Referring now to FIG. 1 to FIG. 5, there is shown a series of schematic air bearing surface (ABS) view and perspective view diagrams illustrating the results of progressive stages in fabrication of a merged inductive magnetic write dual stripe magnetoresistive (DSMR) read magnetic read-write head having fabricated therein a longitudinally magnetically biased dual stripe magnetoresistive (DSMR) sensor element in accord with the present invention. Shown in FIG. 1 is a schematic air bearing surface (ABS) view diagram of the merged inductive magnetic write dual stripe magnetoresistive (DSMR) read magnetic read-write head at an early stage in its fabrication in accord with the method of the present invention.

Shown in FIG. 1 is a substrate 10 having formed thereupon a blanket first shield layer 12 which in turn has formed thereupon a blanket first non-magnetic spacer layer 14. Within the preferred embodiment of the present invention, the substrate 10, the blanket first shield layer 12 and the blanket first non-magnetic spacer layer 14 may be formed employing methods and materials as are conventional in the art of magnetoresistive (MR) sensor element fabrication.

For example, although it is known in the art of magnetoresistive (MR) sensor element fabrication that substrates are typically formed from non-magnetic ceramic materials such as but not limited to oxides, nitrides, borides, carbides and mixtures of oxides, nitrides, borides and carbides, for the preferred embodiment of the present invention, the substrate 10 is preferably formed from a non-magnetic aluminum oxide/titanium carbide ceramic material.

Preferably, the substrate 10 so formed is formed with sufficient dimensions to allow the substrate 10 to be fabricated into a slider employed within a direct access storage device (DASD) magnetic data storage enclosure employed within digitally encoded magnetic data storage and retrieval, although, as noted above, a magnetoresistive (MR) sensor element formed in accord with the present invention may be employed within other digital magnetic storage and transduction applications, as well as analog magnetic signal storage and transduction applications.

Similarly, although it is also known in the art of magnetoresistive (MR) sensor element fabrication that shield layers may be formed from any of several soft magnetic materials, including but not limited to permalloy (ie: nickel-iron alloy) soft magnetic materials and higher order alloy soft magnetic materials incorporating permalloy soft magnetic materials (ie: nickel-iron-rhodium soft magnetic materials and nickel-iron-chromium soft magnetic materials), for the preferred embodiment of the present invention, the blanket first shield layer 12 is preferably formed of a permalloy (ie: nickel-iron 80:20 w/w) soft magnetic material. Preferably, the blanket first shield layer 12 is formed to a thickness of from about 10000 to about 30000 angstroms.

Finally, within the preferred embodiment of the present invention with respect to the blanket first non-magnetic spacer layer 14, although the blanket first non-magnetic spacer layer 14 may be formed employing methods and materials as are conventional in the art of magnetoresistive (MR) sensor element fabrication, including but not limited to chemical vapor deposition (CVD) methods, plasma enhanced chemical vapor deposition (PECVD) methods and physical vapor deposition (PVD) sputtering methods through which may be formed non-magnetic spacer layers of non-magnetic spacer materials including but not limited to conductor non-magnetic spacer materials and dielectric non-magnetic spacer materials (such dielectric non-magnetic spacer materials including but not limited to silicon oxide dielectric materials, silicon nitride dielectric materials, nitrogenated carbon dielectric materials and aluminum oxide dielectric materials), for the preferred embodiment of the present invention, the blanket first non-magnetic spacer layer 14 is preferably formed of an aluminum oxide non-magnetic dielectric spacer material deposited employing a physical vapor deposition (PVD) sputtering method, as is most common in the art of magnetoresistive (MR) sensor element fabrication. Preferably, the blanket first non-magnetic spacer layer 14 so formed is formed to a thickness of from about 200 to about 2000 angstroms.

Although not completely illustrated within the schematic air-bearing surface (ABS) view diagram of FIG. 1, there is also shown within FIG. 1 formed upon the blanket first non-magnetic spacer layer 14 a patterned first magnetoresistive (MR) layer 16. Typically and preferably, the patterned first magnetoresistive (MR) layer 16 is formed from a magnetoresistive (MR) material analogous or equivalent to the soft magnetic material employed for forming the blanket first shield layer 12. Preferably, the patterned first magnetoresistive (MR) layer 16 is formed upon the blanket first non-magnetic spacer layer 14 from a permalloy (nickel-iron, 80:20, w/w) magnetoresistive material to a thickness of from about 80 to about 200 angstroms.

Finally, there is also shown within the schematic air-bearing surface (ABS) view diagram of FIG. 1 a pair of patterned first longitudinal magnetic biasing layers 18a and 18b formed upon a pair of opposite ends of the patterned first magnetoresistive (MR) layer 16 to define a first trackwidth TW1 of the patterned first magnetoresistive (MR) layer 16.

Preferably, the first trackwidth TW1 is from about 0.1 to about 3 microns. The pair of patterned first longitudinal magnetic biasing layers 18a and 18b may be formed of longitudinal magnetic biasing materials as are known in the art of magnetoresistive (MR) sensor element fabrication, including but not limited to antiferromagnetic longitudinal magnetic biasing materials (such as but not limited to iron-manganese alloy longitudinal magnetic biasing materials and nickel-manganese longitudinal magnetic biasing materials), as well as permanent magnet longitudinal magnetic biasing materials (such as but not limited to platinum-cobalt alloy longitudinal magnetic biasing materials, higher order alloys incorporating platinum-cobalt alloy longitudinal magnetic biasing materials, cobalt-chromium alloy longitudinal magnetic biasing materials and rare earth alloy longitudinal magnetic biasing materials), in addition to lesser known longitudinal magnetic biasing materials (such as but not limited to iridium-manganese alloy longitudinal magnetic biasing materials, platinum-manganese alloy longitudinal magnetic biasing materials and platinum-palladium-manganese alloy longitudinal magnetic biasing materials). Preferably, each of the patterned first longitudinal magnetic biasing layers 18a and 18b is formed of an antiferromagnetic longitudinal magnetic biasing material, preferably an nickel-manganese alloy (50:50, w/w) antiferromagnetic longitudinal magnetic biasing material, preferably to a thickness of from about 100 to about 300 angstroms each.

Although not illustrated within the schematic air bearing surface (ABS) view diagram of FIG. 1, there is typically and preferably also formed coextensively upon the pair of patterned first longitudinal magnetic biasing layers 18a and 18b a pair of patterned first conductor lead layers. Illustration of the pair of patterned first conductor lead layers is omitted from the schematic air bearing surface (ABS) view diagram of FIG. 1, in order to provide clarity. Typically and preferably, the pair of patterned first conductor lead layers may be formed simultaneously with the pair of patterned first longitudinal magnetic biasing layers 18a and 18b while employing a lift-off method. Typically and preferably, each patterned first conductor lead layer is formed to a thickness of from about 500 to about 1000 angstroms while employing a conductor lead material conventional in the art of magnetoresistive (MR) sensor element fabrication, such a conductor lead material being selected from the group of conductor lead materials including but not limited to aluminum, aluminum alloy, copper, copper alloy, tungsten, tungsten alloy, gold and gold alloy conductor lead materials.

Finally, although the schematic air-bearing surface (ABS) view diagram of FIG. 1 illustrates the pair of patterned first longitudinal magnetic biasing layers 18a and 18b formed upon the patterned first magnetoresistive layer 16, it is also feasible within the present invention that a pair of patterned first longitudinal magnetic biasing layers, such as the pair of patterned first longitudinal magnetic biasing layers 18a and 18b, either abuts or is formed beneath a patterned first magnetoresistive (MR) layer, such as the patterned first magnetoresistive (MR) layer 16, provided that the pair of patterned first longitudinal magnetic biasing layers contacts a pair of opposite ends of the patterned first magnetoresistive (MR) layer to define a first trackwidth of the patterned first magnetoresistive (MR) layer.

Figure 2:
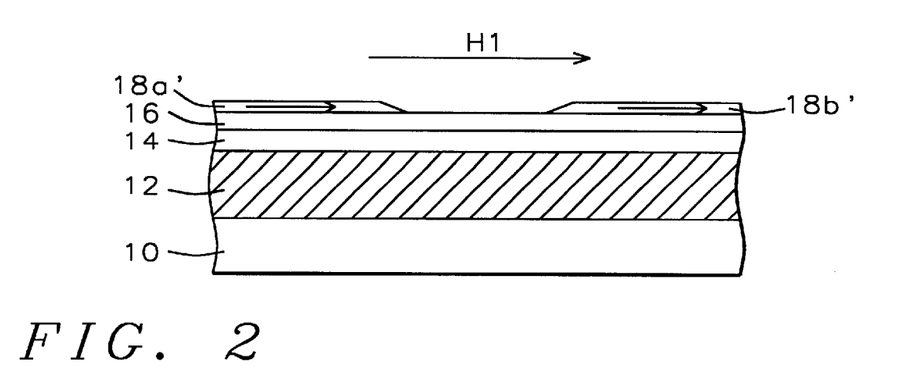

Referring now to FIG. 2, there is shown a schematic air bearing surface (ABS) view diagram illustrating the results of further processing of the merged inductive magnetic write dual stripe magnetoresistive (DSMR) read magnetic read-write head whose schematic air bearing surface (ABS) view diagram is illustrated in FIG. 1. Shown in FIG. 2 is a schematic air bearing surface (ABS) view diagram of an inductive magnetic write dual stripe magnetoresistive (DSMR) read magnetic read-write head otherwise equivalent to the inductive magnetic write dual stripe magnetoresistive (DSMR) read magnetic read-write head whose schematic cross-sectional diagram is illustrated in FIG. 1, but wherein the patterned first longitudinal magnetic biasing layers 18a and 18b are longitudinally magnetically biased by thermal annealing under the influence of an extrinsic magnetic bias field H1 to longitudinally magnetically bias the pair of patterned first longitudinal magnetic biasing layers 18a and 18b in a direction substantially parallel with an axis which separates the pair of patterned first longitudinal magnetic biasing layers 18a and 18b, thus forming from the pair of patterned first longitudinal magnetic biasing layers 18a and 18b a pair of longitudinally magnetically biased patterned first longitudinal magnetic biasing layers 18a' and 18b'.

Although the preferred embodiment of the present invention illustrates the longitudinal magnetic biasing of the pair of patterned first longitudinal magnetic biasing layers 18a and 18b to form the longitudinally magnetically biased patterned first longitudinal magnetic biasing layers 18a' and 18b' by employing the extrinsic magnetic bias field H1 while employing a thermal annealing method after forming the pair of patterned first longitudinal magnetic biasing layers 18a and 18b, it is also feasible within the method of the present invention that the longitudinally magnetically biased patterned first longitudinal magnetic biasing layers 18a' and 18b' may be formed directly incident to forming the patterned first longitudinal magnetic biasing layers 18a and 18b within the external magnetic bias field H1 when originally forming the pair of patterned first longitudinal magnetic biasing layers 18a and 18b.

Within the preferred embodiment of the present invention, the longitudinally magnetically biased patterned first longitudinal magnetic biasing layers 18a' and 18b' are preferably formed employing a thermal annealing method wherein the inductive magnetic write dual stripe magnetoresistive (DSMR) read magnetic read-write head whose schematic air bearing surface (ABS) view diagram is illustrated in FIG. 1 is thermally annealed within the extrinsic magnetic bias field H1 of strength from about 500 to about 2000 oersteds for a time period of from about 30 to about 300 minutes and a temperature of about 250 to about 320 degrees centigrade, under circumstances where the patterned first longitudinal magnetic biasing layers 18a and 18b are each formed of a nickel-manganese (50:50, w/w) antiferromagnetic longitudinal magnetic biasing material as is conventional in the art of magnetoresistive sensor element fabrication. More preferably, and although not specifically illustrated within the schematic cross-sectional diagram of FIG. 2, the longitudinally magnetically biased patterned first longitudinal magnetic biasing layers 18a' and 18b' are preferably formed employing a thermal annealing method wherein the merged inductive write dual stripe magnetoresistive (DSMR) read magnetic read-write head whose schematic cross-sectional diagram is illustrated in FIG. 1, but over which is formed a patterned second magnetoresistive (MR) layer, is thermally annealed within the first magnetic bias field H1 employing the above recited conditions. Under such circumstances, the patterned first magnetoresistive (MR) layer 16 and the patterned second magnetoresistive (MR) layer will typically, incident to their simultaneous thermal annealing, have the same resistance.

Although the schematic air-bearing surface (ABS) view diagram of FIG. 2 illustrates the longitudinally magnetically biased patterned first longitudinal magnetic biasing layers 18a' and 18b' nominally completely aligned with a major axis which separates the pair of longitudinally magnetically biased patterned first longitudinal magnetic biasing layers 18a' and 18b', it is understood by a person skilled in the art that the longitudinally magnetically biased patterned first longitudinal magnetic biasing layers 18a' and 18b' will typically and preferably be only substantially aligned with an acute divergent angle of up to about 60 degrees, and more preferably from about 30 to about 40 degrees, from the major axis of complete alignment. Such substantial alignment is typical incident to thermal annealing methods and magnetically assisted deposition methods as are conventional in the art of magnetoresistive (MR) sensor element fabrication.

Figure 3:
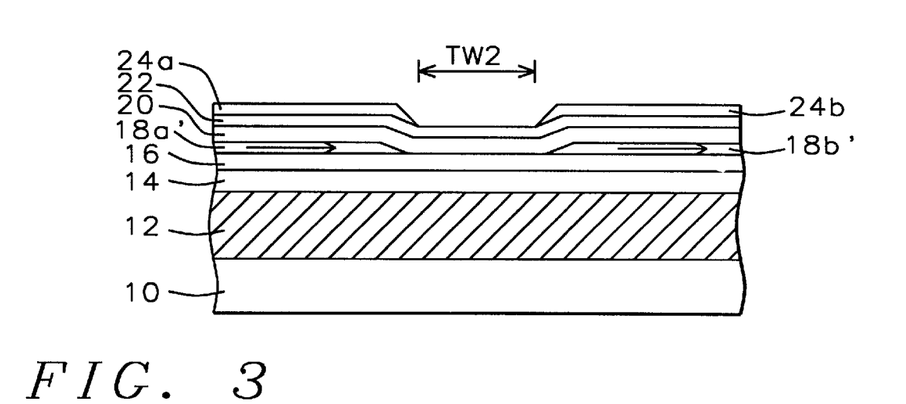

Referring now to FIG. 3, there is shown a schematic air bearing surface (ABS) view diagram illustrating the results of further processing of the merged inductive magnetic write dual stripe magnetoresistive (DSMR) read magnetic read-write head whose schematic air bearing surface (ABS) view diagram is illustrated in FIG. 2. Shown in FIG. 3 is a schematic air bearing surface (ABS) view diagram of an inductive magnetic write dual stripe magnetoresistive (DSMR) read magnetic write-head otherwise equivalent to the inductive magnetic write dual stripe magnetoresistive (MR) read magnetic read-write head whose schematic air bearing surface (ABS) view diagram is illustrated in FIG. 2, but wherein: (1) there is formed upon the pair of longitudinally magnetically biased patterned first longitudinal magnetic biasing layers 18a' and 18b' and upon the first trackwidth TW1 of the patterned first magnetoresistive (MR) layer 16 a blanket second non-magnetic spacer layer 20; (2) there is formed upon the blanket second non-magnetic spacer layer 20 a patterned second magnetoresistive layer 22; and (3) there is formed upon the patterned second magnetoresistive layer 22 a pair of patterned second longitudinal magnetic biasing layers 24a and 24b which define a second trackwidth TW2 of the patterned second magnetoresistive (MR) layer 22. Preferably, the second trackwidth TW2 is of a width and alignment corresponding with the first trackwidth TW1.

Within the preferred embodiment of the present invention, the blanket second non-magnetic spacer layer 20 is preferably formed employing methods, materials and dimensions analogous or equivalent to the methods, materials and dimensions employed for forming the blanket first non-magnetic spacer layer 14. Similarly, within the preferred embodiment of the present invention, the patterned second magnetoresistive layer 22 is preferably formed employing methods, materials and dimensions analogous or equivalent to the methods, materials and dimensions employed for forming the patterned first magnetoresistive layer 16. Finally, within the preferred embodiment of the present invention, the pair of patterned second longitudinal magnetic biasing layers 24a and 24b is preferably formed employing methods, materials and dimensions analogous or equivalent to the methods, materials and dimensions employed for forming the pair of patterned first longitudinal magnetic biasing layers 18a and 18b. In particular, the pair of patterned second longitudinal magnetic biasing layers 24a and 24b and the pair of patterned first longitudinal magnetic biasing layers 18a and 18b are formed of a single longitudinal magnetic biasing material. Analogously with the patterned first longitudinal magnetic biasing layers 18a and 18b, and similarly also not illustrated within the schematic air bearing surface (ABS) view diagram of FIG. 3, the pair of patterned second longitudinal magnetic biasing layers 24a and 24b also preferably has formed and aligned thereupon, while similarly also preferably employing a lift off method, a pair of patterned second conductor lead layers.

Figure 4A:
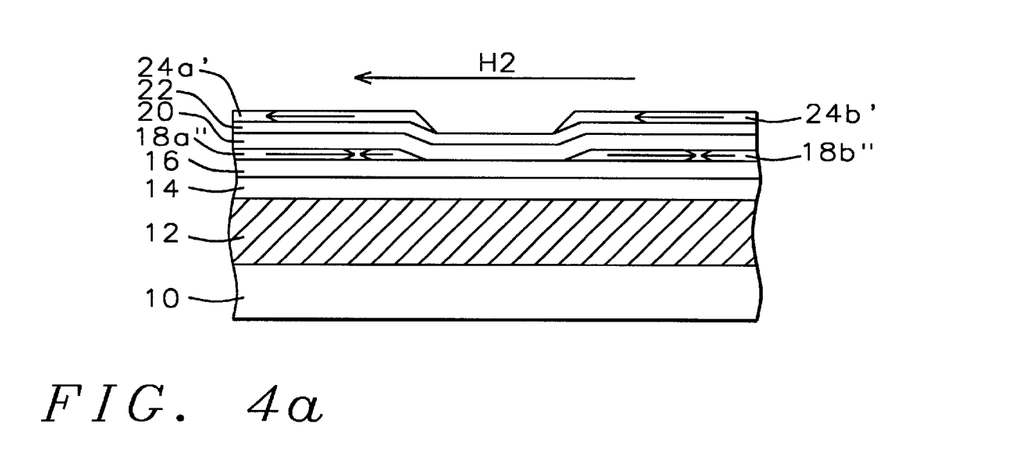

Referring now to FIG. 4a, there is shown a schematic air bearing surface (ABS) view diagram illustrating the results of further processing of the merged inductive magnetic write dual stripe magnetoresistive (DSMR) read magnetic read-write head whose schematic air bearing surface (ABS) view diagram is illustrated in FIG. 3. Shown in FIG. 4a is a schematic air bearing surface (ABS) view diagram of an inductive magnetic write dual stripe magnetoresistive (DSMR) read magnetic read-write head otherwise equivalent to the inductive magnetic write dual stripe magnetoresistive (DSMR) read magnetic read-write head whose schematic air bearing surface (ABS) view diagram is illustrated in FIG. 3, but wherein the patterned second longitudinal magnetic biasing layers 24a and 24b have been longitudinally magnetically biased while employing a second extrinsic magnetic field H2 anti-parallel to the first extrinsic magnetic field H1 as illustrated within the schematic air bearing surface (ABS) view diagram of FIG. 2, to provide the longitudinally magnetically biased patterned second longitudinal magnetic biasing layers 24a' and 24b'.

Within the preferred embodiment of the present invention, the patterned second longitudinal magnetic biasing layers 24a and 24b are longitudinally magnetically biased substantially anti-parallel with respect to the longitudinally magnetically biased patterned first longitudinal magnetic biasing layers 18a' and 18b' as illustrated in FIG. 2, while employing a thermal annealing method which employs a thermal annealing temperature and a thermal annealing exposure time, in conjunction with a second extrinsic magnetic field H2 of appropriate magnetic field strength, such that the pair of patterned second longitudinal magnetic biasing layers 24a and 24b is longitudinally magnetically biased to form the pair of longitudinally magnetically biased patterned second longitudinal magnetic biasing layers 24a' and 24b' while not substantially de-magnetizing the pair of longitudinally magnetically biased patterned first longitudinal magnetic biasing layers 18a' and 18b' which then form a pair of partially demagnetized longitudinally magnetically biased patterned first longitudinal magnetic biasing layers 18a" and 18b", as illustrated within the schematic air bearing surface (ABS) view diagram of FIG. 4a.

For the preferred embodiment of the present invention when both the pair of patterned first longitudinal magnetic biasing layers 18a and 18b, as well as the pair of patterned second longitudinal magnetic biasing layers 24a and 24b, are formed of a nickel-manganese alloy (50:50, w/w) anti-ferromagnetic longitudinal magnetic biasing material, the pair of patterned second longitudinal magnetic biasing layers is preferably thermally annealed at a thermal annealing temperature of from about 250 to about 320 degrees centigrade for a thermal annealing exposure time period of from about 30 to about 300 minutes within the extrinsic second magnetic bias field H2 of strength about 500 to about 2000 oersteds. Preferably, the thermal annealing is undertaken under a nitrogen atmosphere.

Within the present invention, it is preferred that the pair of longitudinally magnetically biased patterned first longitudinal magnetic biasing layers 18a' and 18b' not be demagnetized to an extent greater than about 25 percent when forming the pair of partially demagnetized longitudinally magnetically biased patterned first longitudinally magnetic biasing layers 18a" and 18b" incident to forming the pair of longitudinally magnetically biased patterned second longitudinal magnetic biasing layers 24a' and 24b' from the pair of patterned second longitudinal magnetic biasing layers 24a and 24b. Thus, within the present invention, there is exploited at an appropriate thermal annealing temperature, thermal annealing exposure time and second magnetic bias field H2 strength a more facile magnetization of a pair of unmagnetized patterned second longitudinal magnetic biasing layers 24a and 24b in comparison with a less facile demagnetization of a pair of longitudinally magnetically biased patterned first longitudinally biased layers 18a' and 18b'.

Figure 4B:
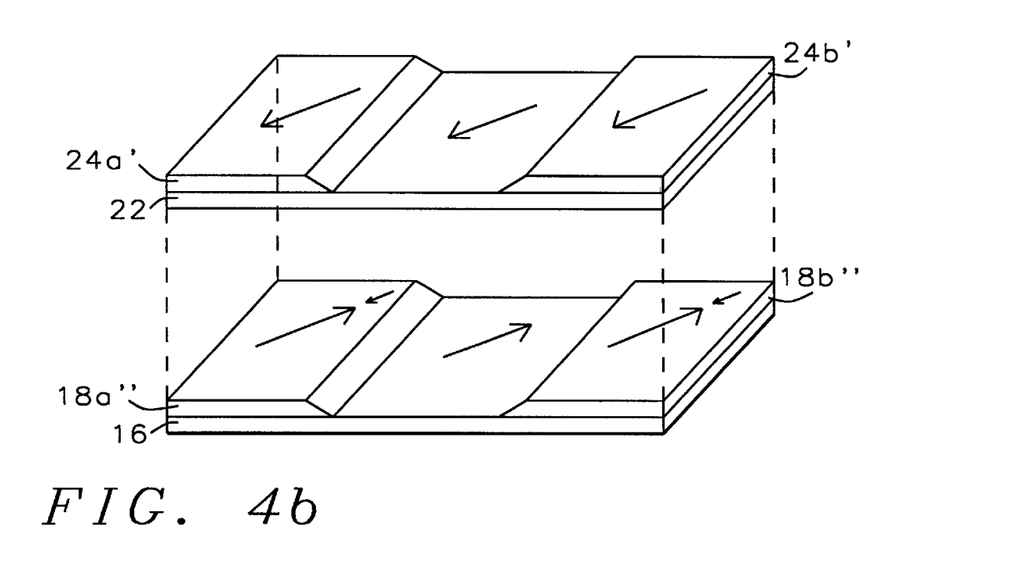

Referring now to FIG. 4b, there is shown a schematic perspective view diagram corresponding with the schematic cross-sectional diagram of FIG. 4a. Shown in FIG. 4b is the patterned first magnetoresistive (MR) layer 16 having formed upon a pair of its opposite ends the pair of partially demagnetized longitudinally magnetically biased patterned first longitudinal magnetic biasing layers 18a" and 18b". Similarly, there is also shown within FIG. 4b the patterned second magnetoresistive layer 22 having formed and aligned thereupon the pair of longitudinally magnetically biased patterned second longitudinal magnetic biasing layers 24a' and 24b'. All other layers within the merged inductive magnetic write dual stripe magnetoresistive (DSMR) read magnetic read-write head whose schematic cross-sectional diagram is illustrated in FIG. 4a have been omitted for clarity.

Similarly, although both FIG. 4a and FIG. 4b illustrate the second thermal annealing for forming the pair of longitudinally magnetically biased patterned second longitudinal magnetic biasing layers 24a' and 24b' as occurring immediately after forming the pair of patterned second longitudinal magnetic biasing layers 24a and 24b upon the patterned second magnetoresistive (MR) layer 22, within the method of the present invention, the second thermal annealing may often preferably be undertaken at a later stage in processing of merged inductive magnetic write dual stripe magnetoresistive (DSMR) read magnetic read-write head whose schematic cross-sectional diagram is illustrated in FIG. 4a and whose schematic perspective-view diagram is illustrated in FIG. 4b. For example, and without limitation, the second thermal annealing may be undertaken after write element structures are formed within the merged inductive magnetic write dual stripe magnetoresistive (DSMR) read magnetic read-write head whose schematic cross-sectional diagram is illustrated in FIG. 4a and whose schematic perspective-view diagram is illustrated in FIG. 4b. Under such circumstances, the second thermal annealing may, for example, thermally anneal and stabilize a magnetic write pole layer and a magnetic write coil.

Figure 5:
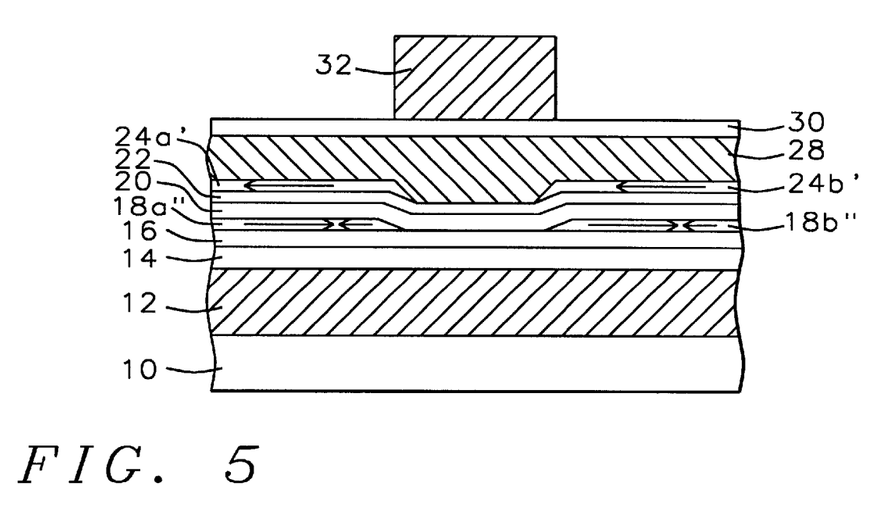

Referring now to FIG. 5, there is shown a schematic air bearing surface (ABS) view diagram illustrating the results of further processing of the merged inductive magnetic write dual stripe magnetoresistive (DSMR) read magnetic read-write head whose schematic air bearing surface (ABS) view diagram is illustrated in FIG. 4a.

Shown in FIG. 5 is a schematic air bearing surface (ABS) view diagram of an inductive magnetic write dual stripe magnetoresistive (DSMR) read magnetic read-write head otherwise equivalent to the inductive magnetic write dual stripe magnetoresistive (DSMR) read magnetic read-write head whose schematic air bearing surface (ABS) view diagram is illustrated in FIG. 4, but wherein: (1) there is formed upon the pair of longitudinally magnetically biased patterned second longitudinal magnetic biasing layers 24a' and 24b' and the second trackwidth TW2 of the patterned second magnetoresistive layer 22 a blanket third non-magnetic spacer layer 26; (2) there is formed upon the blanket third non-magnetic spacer layer 26 a blanket second shield layer 28 which simultaneously serves as a blanket first magnetic inductor write pole layer; (3) there is formed upon the blanket second shield layer 28 a blanket fourth non-magnetic write gap filling spacer layer 30; and (4) there is formed upon the blanket fourth non-magnetic write gap filling spacer layer 30 a patterned second magnetic inductor write pole layer 32.

Within the preferred embodiment of the present invention, the blanket third non-magnetic spacer layer 26 is preferably formed employing methods, materials and dimensions analogous or equivalent to the methods, materials and dimensions employed for forming the blanket second non-magnetic spacer layer 20 and the blanket first non-magnetic spacer layer 14. Similarly, within the preferred embodiment of the present invention the blanket second shield layer 28 is preferably formed employing methods, materials and dimensions analogous or equivalent to the methods, materials and dimensions employed for forming the blanket first shield layer 12. Yet similarly, for the preferred embodiment of the present invention, the blanket fourth non-magnetic write gap filling spacer layer 30 is preferably formed employing methods, materials and dimensions analogous or equivalent to the methods, materials and dimensions employed for forming the blanket third non-magnetic spacer layer 26, the blanket second non-magnetic spacer layer 20 and the blanket first non-magnetic spacer layer 14. Finally, within the preferred embodiment of the present invention, the patterned second magnetic inductor write pole layer 32 is preferably formed employing methods materials and thickness dimensions analogous or equivalent to the methods, materials and thickness dimensions employed for forming the blanket second shield layer 28, but of a narrower width dimension in the range of from about 0.1 to about 3 microns to correspond with the first trackwidth TW1 of the patterned first magnetoresistive layer 16 and the second trackwidth TW2 of the patterned second magnetoresistive (MR) layer 22.

Upon forming the merged inductive magnetic write dual stripe magnetoresistive (DSMR) read magnetic read-write head whose schematic air bearing surface (ABS) view diagram is illustrated in FIG. 5, there is formed a merged inductive magnetic write dual stripe magnetoresistive (DSMR) read magnetic read-write head with enhanced longitudinal magnetic bias profile uniformity within the trackwidth of the merged inductive magnetic write dual stripe magnetoresistive (DSMR) read magnetic read-write head. The merged inductive magnetic write dual stripe magnetoresistive (MR) read magnetic read-write head of the present invention realizes the foregoing object by employing an anti-parallel longitudinal magnetic biasing of two pair of patterned longitudinal magnetic biasing layers which longitudinally magnetically bias a pair of patterned magnetoresistive (MR) layers within the merged inductive magnetic write dual stripe magnetoresistive (DSMR) read magnetic read-write head. The two pair patterned longitudinally magnetic biasing layers are formed of a single longitudinal magnetic biasing material. Similarly, the method of the present invention employs when forming a pair of longitudinally magnetically biased patterned second longitudinal magnetic biasing layers upon a patterned second magnetoresistive (MR) layer a thermal annealing method employing: (1) a thermal annealing temperature; (2) a thermal annealing exposure time; and (3) an extrinsic magnetic bias field strength, such that the pair of longitudinally magnetically biased patterned second longitudinal magnetic biasing layers is longitudinally magnetically biased while not substantially de-magnetizing a pair of longitudinally magnetically biased patterned first longitudinal magnetic biasing layers which longitudinally magnetically bias a patterned first magnetoresistive (MR) layer in a direction anti-parallel to the patterned second magnetoresistive (MR) layer.

As is understood by a person skilled in the art, the preferred embodiment of the present invention is illustrative of the present invention rather than limiting of the present invention. Revisions and modifications may be made to materials, structures and dimensions through which is provided a dual stripe magnetoresistive (DSMR) sensor element in accord with the preferred embodiment of the present invention while still providing a dual stripe magnetoresistive (MR) sensor element in accord with the spirit and scope of the present invention, as defined by the following claims.

What is claimed is:

1. A method for forming a longitudinally magnetically biased dual stripe magnetoresistive (DSMR) sensor element comprising:

providing a substrate;

forming over the substrate a patterned first magnetoresistive (MR) layer;

forming contacting a pair of opposite ends of the patterned first magnetoresistive (MR) layer a pair of patterned first longitudinal magnetic biasing layers which defines a first trackwidth of the patterned first magnetoresistive (MR) layer, the pair of patterned first longitudinal magnetic biasing layers being biased in a first longitudinal magnetic bias direction substantially parallel with an axis of the patterned first magnetoresistive (MR) layer which separates the pair of patterned first longitudinal magnetic biasing layers;

forming separated from the patterned first magnetoresistive layer by a non-magnetic spacer layer a patterned second magnetoresistive layer;

forming contacting a pair of opposite ends of the patterned second magnetoresistive (MR) layer a pair of patterned second longitudinal magnetic biasing layers which defines a second trackwidth of the patterned second magnetoresistive (MR) layer, the pair of patterned second longitudinal magnetic biasing layers being biased in a second longitudinal magnetic bias direction substantially anti-parallel with the first longitudinal magnetic bias direction, wherein:

the pair of patterned first longitudinal magnetic biasing layers and the pair of patterned second longitudinal magnetic biasing layers are formed of a single longitudinal magnetic biasing magnetic material; and the pair of patterned second longitudinal magnetic biasing layers is biased employing a thermal annealing method employing a thermal annealing temperature, a thermal annealing exposure time and an extrinsic magnetic bias field strength such that the pair of patterned second longitudinal magnetic biasing layers is biased in the second longitudinal magnetic bias direction while the pair of patterned first longitudinal magnetic biasing layers is not substantially demagnetized from the first longitudinal magnetic bias direction.

2. The method of claim 1 wherein the dual stripe magnetoresistive (DSMR) sensor element is employed within a magnetic head selected from the group consisting of merged inductive magnetic write magnetoresistive (MR) read magnetic read-write heads, non-merged inductive magnetic write magnetoresistive (MR) read magnetic read-write heads and magnetoresistive (MR) read only heads.

3. The method of claim 1 wherein the longitudinal magnetic biasing material is selected from the group consisting of antiferromagnetic longitudinal magnetic biasing materials and permanent magnet longitudinal magnetic biasing materials.

4. The method of claim 1 where:
the longitudinal magnetic biasing material is an nickel-manganese alloy (50:50, w/w) antiferromagnetic longitudinal magnetic biasing material; and
the thermal annealing temperature is from about 250 to about 320 degrees centigrade;
the thermal annealing exposure time is from about 30 to about 300 minutes; and
the extrinsic magnetic bias field strength is from about 500 to about 2000 oersteds.

5. The method of claim 1 wherein the pair of longitudinally magnetically biased patterned first longitudinal magnetic biasing layers is demagnetized no greater than about 25 percent when forming the pair of longitudinally magnetically biased patterned second longitudinal magnetic biasing layers.

6. The method of claim 1 wherein the longitudinal magnetically biased patterned first longitudinal magnetic biasing layers are longitudinally magnetically biased employing an additional thermal annealing method which simultaneously thermally anneals the patterned first magnetoresistive layer and the patterned second magnetoresistive layer.

7. The method of claim 1 wherein the thermal annealing method also thermally anneals an inductive magnetic write structure formed in conjunction with the dual stripe magnetoresistive (DSMR) sensor element.

8. A dual stripe magnetoresistive (DSMR) exchange biased sensor element comprising:
a substrate;
a patterned first magnetoresistive (MR) layer formed over the substrate;
a pair of longitudinally magnetically biased patterned first longitudinal magnetic biasing layers formed contacting a pair of opposite ends of the patterned first magnetoresistive (MR) layer;
a patterned second magnetoresistive (MR) layer separated from the patterned first magnetoresistive (MR) layer by a least a non-magnetic spacer layer; and
a pair of longitudinally magnetically biased patterned second longitudinal magnetic biasing layers formed contacting a pair of opposite ends of the patterned second magnetoresistive (MR) layer, wherein;
the pair of longitudinally magnetically biased patterned second longitudinal magnetic biasing layers and the pair of longitudinally magnetically biased patterned first longitudinal magnetic biasing layers are formed of the same magnetic biasing material; and
the pair of longitudinally magnetically biased patterned second longitudinal magnetic biasing layers and the pair of longitudinally magnetically biased patterned first longitudinal magnetic biasing layers formed of the same magnetic biasing material are formed of magnetic biasing material selected from the group consisting of antiferromagnetic biasing materials and ferromagnetic biasing materials; and
the pair of longitudinally magnetically biased patterned second longitudinal magnetic biasing layers and the pair of longitudinally magnetically biased patterned first longitudinal magnetic biasing layers are longitudinally magnetically biased in substantially anti-parallel directions; and
the pair of longitudinally magnetically biased patterned second longitudinal magnetic biasing layers is exchange coupled to the patterned second magnetoresistive (MR) layer and the pair of longitudinally magnetically biased patterned first longitudinal magnetic biasing layers is exchange coupled to the patterned first magnetoresistive (MR) layer.

9. The dual stripe magnetoresistive (DSMR) sensor element of claim 8 wherein the patterned first magnetoresistive (MR) layer and the patterned second magnetoresistive (MR) layer have the same resistance.

* * * * *